United States Patent
Baeckler et al.

(10) Patent No.: US 9,330,740 B1
(45) Date of Patent: May 3, 2016

(54) FIRST-IN FIRST-OUT CIRCUITS AND METHODS

(71) Applicant: Altera Corporation, San Jose, CA (US)

(72) Inventors: Gregg William Baeckler, San Jose, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 214 days.

(21) Appl. No.: 14/133,245

(22) Filed: Dec. 18, 2013

(51) Int. Cl.
*G11C 7/22* (2006.01)

(52) U.S. Cl.
CPC .................................... *G11C 7/222* (2013.01)

(58) Field of Classification Search
CPC ........................................................ G11C 7/22
USPC .................................................... 365/189.14
See application file for complete search history.

(56) References Cited

U.S. PATENT DOCUMENTS

| 6,327,207 | B1* | 12/2001 | Sluiter ...................... G06F 5/10 365/189.07 |
| 2003/0081713 | A1 | 5/2003 | Evoy et al. | |
| 2010/0174877 | A1* | 7/2010 | Yagihashi .................. G06F 5/14 711/155 |
| 2013/0205160 | A1 | 8/2013 | Turner et al. | |
| 2014/0215104 | A1* | 7/2014 | Mirchandani ............. G06F 1/00 710/51 |

OTHER PUBLICATIONS

Clifford E. Cummings, "Simulation and Synthesis Techniques for Asynchronous FIFO Design," Sunburst Design, Inc., SNUG San Jose 2002, pp. 1-23.
Clifford E. Cummings, "Simulation and Synthesis Techniques for Asynchronous FIFO Design with Asynchronous Pointer Comparisons," Sunburst Design, Inc., SNUG San Jose 2002, pp. 1-18.
"FIFO," Wikipedia, the free encyclopedia, Oct. 10, 2013. pp. 1-4.

* cited by examiner

*Primary Examiner* — Hoai V Ho
*Assistant Examiner* — Tri Hoang
(74) *Attorney, Agent, or Firm* — Steven J. Cahill

(57) ABSTRACT

A first first-in first-out (FIFO) circuit includes a storage circuit, a second first-in first-out (FIFO) circuit, and a third first-in first-out (FIFO) circuit. The storage circuit stores write data at a write address in response to a write clock signal. The storage circuit outputs read data from a read address in response to a read clock signal. A write pointer indicating the write address is synchronized with the write clock signal. A read pointer indicating the read address is synchronized with the read clock signal. The second first-in first-out (FIFO) circuit synchronizes the write pointer with the read clock signal. The third first-in first-out (FIFO) circuit synchronizes the read pointer with the write clock signal.

22 Claims, 6 Drawing Sheets

FIRST-IN FIRST-OUT CIRCUITS AND METHODS

FIELD OF THE DISCLOSURE

The present disclosure relates to electronic circuits, and more particularly, to first-in first-out circuits and methods.

BACKGROUND

First-in first-out (FIFO) circuits are used in electronic circuits for buffering and flow control. A FIFO circuit may include dual-port storage, where one port of the storage is used for writing and the other port of the storage is used for reading. A single clock FIFO circuit uses the same clock signal for both reading and writing. A dual clock FIFO circuit uses different clock signals for reading and writing. As a result, dual clock FIFO circuits may introduce metastability issues.

BRIEF SUMMARY

According to some embodiments, a first first-in first-out (FIFO) circuit includes a storage circuit, a second first-in first-out (FIFO) circuit, and a third first-in first-out (FIFO) circuit. The storage circuit stores write data at a write address in response to a write clock signal. The storage circuit outputs read data from a read address in response to a read clock signal. A write pointer indicating the write address is synchronized with the write clock signal. A read pointer indicating the read address is synchronized with the read clock signal. The second first-in first-out (FIFO) circuit synchronizes the write pointer with the read clock signal. The third first-in first-out (FIFO) circuit synchronizes the read pointer with the write clock signal.

Various objects, features, and advantages of the present invention will become apparent upon consideration of the following detailed description and the accompanying drawings.

DETAILED DESCRIPTION

Figure 1:
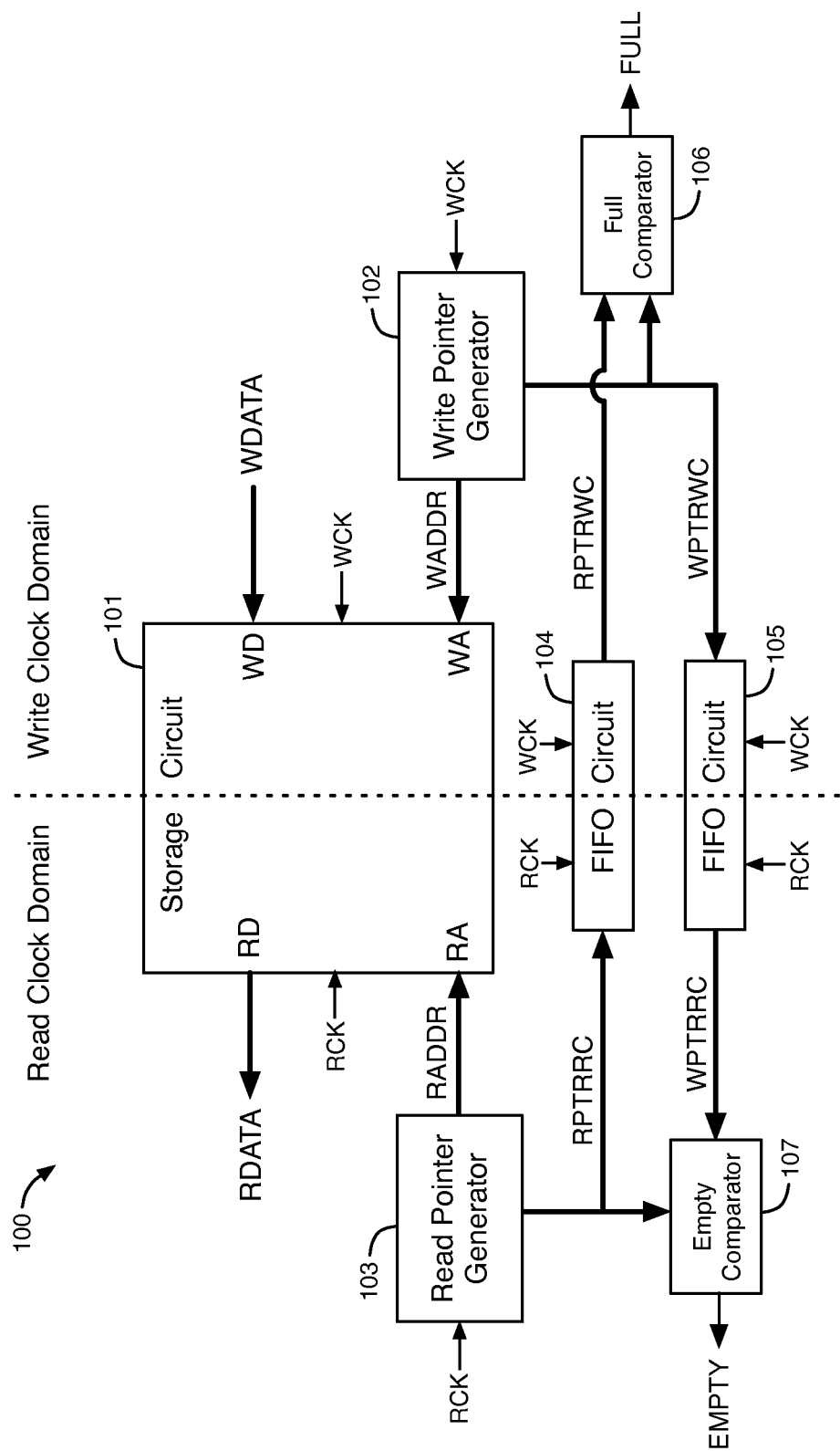
FIG. 1 illustrates an example of a first-in first-out (FIFO) circuit that includes two component FIFO circuits, according to an embodiment of the present invention.

An integrated circuit may have two or more clock domains. Each clock domain includes one or more circuits. Timing circuits within a single clock domain are clocked by the same clock signal. Timing circuits in two different clock domains are clocked by two different clock signals that may have two different frequencies. Parallel data bits often cannot be transferred from register circuits in one clock domain to register circuits in another clock domain without generating errors in the data if the two clock domains have different clock frequencies or different clock phases.

A dual clock FIFO circuit may be used to transfer data from a first clock domain in an integrated circuit to a second clock domain in the integrated circuit without generating errors in the data. Timing circuits in the first clock domain are clocked by a first clock signal having a different frequency than a second clock signal that clocks timing circuits in the second clock domain. A dual clock FIFO circuit may also be referred to as an asynchronous FIFO circuit. A write pointer generated in the first clock domain indicates a write address in the FIFO circuit where data is being stored in the FIFO circuit. A read pointer generated in the second clock domain indicates a read address in the FIFO circuit where data is being read from the FIFO circuit.

A first synchronizer circuit provides the write pointer to the second clock domain through registers clocked by the second clock signal. The write pointer output by the first synchronizer circuit is compared to the read pointer within the second clock domain to generate an indication of when the FIFO circuit is empty. When the FIFO circuit is empty, data cannot be read from the FIFO circuit, until additional data has been stored in the FIFO circuit. A second synchronizer circuit provides the read pointer to the first clock domain through registers clocked by the first clock signal. The read pointer output by the second synchronizer circuit is compared to the write pointer within the first clock domain to generate an indication of when the FIFO circuit is full. When the FIFO circuit is full, additional data cannot be stored in the FIFO circuit without overwriting data that has not yet been read from the FIFO circuit.

Each read or write pointer may contain multiple parallel digital bits (e.g. 4-12 parallel bits). When a read or write pointer is provided from one clock domain to a different clock domain having a different frequency, skew between the parallel digital bits may cause the synchronizer circuit to output an inaccurate value of the pointer. The skew may, for example, be caused by different routing delays being provided within the integrated circuit to the different parallel digital bits. Some FIFO circuits encode the read and write pointers using Gray codes. In FIFO circuits that use Gray codes for the pointers, each two successive values of the read pointers differ by only one bit, and each two successive values of the write pointers differ by only one bit. Gray codes can reduce the negative effects of skew if the amount of skew between the parallel digital bits that indicate a pointer is less than one period (i.e., one cycle) of the first or second clock signal having the greater frequency.

However, if the amount of skew between the parallel digital bits that indicate a pointer is greater than one period of the first or second clock signal having the greater frequency, then the synchronizer circuit may output an incorrect value for the pointer that equals neither the current nor the previous value of the pointer. Skew may become particularly problematic if the first or second clock signal has a very high frequency. If the first synchronizer circuit outputs an incorrect value for the write pointer that equals neither the current nor the previous value of the write pointer, the indication of when the FIFO circuit is empty is inaccurate. If the second synchronizer circuit outputs an incorrect value for the read pointer that equals neither the current nor the previous value of the read pointer, the indication of when the FIFO circuit is full is inaccurate. If the indication of when the FIFO circuit is full is inaccurate, data stored in the FIFO circuit that has not yet been read from the FIFO circuit may be overwritten, causing the overwritten data to be lost.

According to some exemplary embodiments disclosed herein, a first-in first-out (FIFO) circuit includes two component FIFO circuits. As an example, a first FIFO circuit includes a storage circuit, a second FIFO circuit, a third FIFO circuit, a read pointer generator, a write pointer generator, an empty comparator, and a full comparator. Data is stored in the storage circuit in response to a write clock signal in a write clock domain. Data is read from the storage circuit in response to a read clock signal in a read clock domain. The write pointer generator generates a write pointer for each set of data bits stored in the storage circuit in response to the write clock signal. The read pointer generator generates a read pointer for each set of data bits read from the storage circuit in response to the read clock signal. The second FIFO circuit provides each write pointer from the write clock domain to the read clock domain. The second FIFO circuit may replace the first synchronizer circuit. The empty comparator compares the read pointer to the write pointer in the read clock domain to generate an indication of when the storage circuit is empty. The third FIFO circuit provides each read pointer from the read clock domain to the write clock domain. The third FIFO circuit may replace the second synchronizer circuit. The full comparator compares the write pointer to the read pointer in the write clock domain to generate an indication of when the storage circuit is full.

FIG. 1 illustrates an example of a first-in first-out (FIFO) circuit 100 that includes two component FIFO circuits, according to an embodiment of the present invention. FIFO circuit 100 includes a storage circuit 101, a write pointer generator circuit 102, a read pointer generator circuit 103, a first-in first-out (FIFO) circuit 104, a first-in first-out (FIFO) circuit 105, a full comparator circuit 106, and an empty comparator circuit 107. Write pointer generator circuit 102 is coupled to storage circuit 101, to FIFO circuit 105, and to full comparator 106. Read pointer generator circuit 103 is coupled to storage circuit 101, to FIFO circuit 104, and to empty comparator 107.

FIFO circuit 100 may be formed in any type of integrated circuit, such as a field programmable gate array (FPGA) or an application specific integrated circuit (ASIC). FIFO circuit 100 may, for example, be formed using programmable logic circuits in an FPGA, using non-programmable circuits in an FPGA or ASIC, or any combination of programmable circuits and non-programmable circuits.

FIFO circuit 100 is a dual clock FIFO circuit that provides data from a write clock domain to a read clock domain. Timing circuits in the write clock domain are clocked by a write clock signal WCK. Timing circuits in the read clock domain are clocked by a read clock signal RCK. In some embodiments, the write clock signal WCK has a different frequency and a different period than the read clock signal RCK. Some circuits cannot transmit data between two different clock domains having two different clock frequencies without generating errors in the data. FIFO circuit 100 can provide data from the write clock domain to the read clock domain without generating errors in the data.

During the operation of FIFO circuit 100, write data indicated by one or more write data signals WDATA are provided to one or more write data inputs WD of storage circuit 101. WDATA may include only one signal or multiple signals. If the write data is indicated by multiple write data signals WDATA, the write data signals WDATA are provided in parallel to a corresponding number of write data inputs WD of storage circuit 101. As an example, the write data signals WDATA may indicate a word of write data. Each word of write data may have any number of parallel digital bits (for example, 8, 16, 24, 32, 48, or 64 bits) indicated by an equal number of parallel write data signals WDATA.

Write pointer generator circuit 102 generates a write address for each word of write data that is indicated by the write data signals WDATA. Each word of write data is stored in storage circuit 101 at the corresponding write address. The write address is provided to storage circuit 101. Write pointer generator circuit 102 generates one or more write address signals WADDR that indicate a write address in response to write clock signal WCK. Write pointer generator circuit 102 causes the write address signals WADDR and the write address indicated by the write address signals WADDR to be synchronized with the write clock signal WCK. If write pointer generator circuit 102 generates two or more write address signals WADDR to indicate each write address, the write address signals WADDR are provided in parallel as multiple parallel address bits to write address inputs WA of storage circuit 101.

Write pointer generator circuit 102 may contain any suitable circuitry that generates the write addresses. As an example, storage circuit 101 may have several storage locations that are identified by numerically consecutive addresses, and write pointer generator circuit 102 may include a counter circuit that generates numerically consecutive write addresses that increase by 1 (or decrease by 1) in each period of the write clock signal WCK. As another example, storage circuit 101 may have storage locations that are identified by non-consecutive addresses, and write pointer generator circuit 102 may generate non-consecutive write addresses. The write addresses generated by write pointer generator circuit 102 may be, for example, encoded using binary encoding, encoded with Gray codes, or encoded using another encoding technique.

Storage circuit 101 may be any suitable type of storage circuit. For example, storage circuit 101 may be a random access memory (RAM), such as static RAM or dynamic RAM. As another example, storage circuit 101 may include register circuits, such as flip-flop circuits. As another example, storage circuit 101 may include flash memory or another type of non-volatile memory.

Each word of write data indicated by the write data signals WDATA is stored in storage circuit 101 at a storage location that is identified by a corresponding write address indicated by the write address signals WADDR. Storage circuit 101 stores the words of write data in response to the write clock signal WCK. Storage circuit 101 may include several storage locations. Each storage location in storage circuit 101 contains enough storage space to store a word of data. Each unique storage location in storage circuit 101 is identified by a unique address.

In an embodiment, the first word of write data received in write data signals WDATA is stored in the first storage location in storage circuit 101. Each word of write data subsequently received in write data signals WDATA is stored in the next storage location identified by the next write address in storage circuit 101, until write data has been stored in all of the storage locations in storage circuit 101. After a word of write data has been stored in the last storage location in storage circuit 101, the next word of write data received in signals WDATA is stored in the first storage location in storage circuit 101, and then the process described with respect to this embodiment repeats.

As an example that is provided for illustration and is not intended to be limiting, if storage circuit 101 has 128 storage locations that are identified by addresses 0-127, the first word of write data received in write data signals WDATA is stored in the storage location at address 0, the second word of write data received in write data signals WDATA is stored in the storage location at address 1, the third word of write data received in write data signals WDATA is stored in the storage location at address 2, etc. The $4^{th}$ through the $128^{th}$ words of write data received in write data signals WDATA are stored in the storage locations at address 3-127, respectively, in storage circuit 101. After the $128^{th}$ word of write data is stored in the storage location at address 127, the $129^{th}$ word of write data received in write data signals WDATA is stored in the storage location at address 0. The $130^{th}$-$256^{th}$ words of write data received in signals WDATA are consecutively stored in the storage locations at addresses 1-127, respectively, in storage circuit 101. The $257^{th}$ word of write data received in WDATA is stored in the storage location at address 0 in storage circuit 101, and then this process continues to repeat.

During the operation of FIFO circuit 100, storage circuit 101 outputs one or more read data signals RDATA that indicate read data. The one or more read data signals RDATA are provided from one or more read data outputs RD of storage circuit 101. The read data may be indicated by only one read data signal or by multiple read data signals. If the read data is indicated by multiple read data signals RDATA, the read data signals RDATA are output in parallel from an equal number of read data outputs RD of storage circuit 101. As an example, the read data signals RDATA may indicate a word of read data. Each word of read data may have any number of parallel digital bits (for example, 8, 16, 24, 32, 48, or 64 bits) indicated by an equal number of parallel read data signals RDATA. In an embodiment, each word of read data may have the same number of parallel bits as each word of the write data. In another embodiment, one or more read data signals RDATA may indicate serial read data bits, and one or more write data signals WDATA may indicate serial write data bits.

Read pointer generator circuit 103 generates a read address for each word of read data to be read from storage circuit 101. The read address is provided to storage circuit 101. Read pointer generator circuit 103 generates one or more read address signals RADDR that indicate the read address for each word of read data in response to read clock signal RCK. Each word of read data is read from storage circuit 101 at the read address indicated by the read address signals RADDR generated for that word of read data. Read pointer generator circuit 103 causes the read address signals RADDR and the read address indicated by the read address signals RADDR to be synchronized with the read clock signal RCK. The read address signals RADDR are provided to one or more read address inputs RA of storage circuit 101. If read pointer generator circuit 103 generates two or more read address signals RADDR to indicate each read address, the read address signals RADDR for each read address are provided in parallel as multiple parallel address bits to multiple read address inputs RA of storage circuit 101.

Read pointer generator circuit 103 may contain any suitable circuitry that generates the read addresses. As an example, read pointer generator circuit 103 may include a counter circuit that generates numerically consecutive values for the read addresses in response to read clock signal RCK. The numerically consecutive values for the read addresses may, for example, increase by 1 (or decrease by 1) in each period of the read clock signal RCK. If storage circuit 101 has storage locations that are identified by non-consecutive addresses, read pointer generator circuit 103 may generate non-consecutive values for the read addresses. The read addresses generated by read pointer generator circuit 103 may be, for example, encoded using binary encoding, encoded with Gray codes, or encoded with another suitable encoding technique. In an embodiment, both the read and write addresses are encoded using the same encoding technique, for example, binary encoding.

In response to each read address generated in the read address signals RADDR, storage circuit 101 accesses the word of data stored in the storage location that is identified by the read address indicated by the read address signals RADDR in response to read clock signal RCK. The word of data accessed from the storage location of storage circuit 101 at the read address indicated by the read address signals RADDR is output from storage circuit 101 as the read data. Storage circuit 101 causes the read data signals RDATA to indicate the word of read data stored in the storage location that is identified by the read address indicated by the read address signals RADDR. Storage circuit 101 outputs the read data signals RDATA in response to the read clock signal RCK.

During the operation of FIFO circuit 100, words of data are read from storage circuit 101 in the same order that the words of data were stored in storage circuit 101. Using the example described above in which storage circuit 101 has 128 storage locations that are identified by addresses 0-127, the first word of read data provided as read data signals RDATA is read from the storage location at address 0, the second word of read data provided as read data signals RDATA is read from the storage location at address 1, the third word of read data provided as read data signals RDATA is read from the storage location at address 2, etc. The $4^{th}$ through the $128^{th}$ words of read data provided as read data signals RDATA are read from the storage locations at address 3-127, respectively, in storage circuit 101. After the $128^{th}$ word of read data is read from the storage location at address 127, the $129^{th}$ word of read data is provided from the storage location at address 0 in storage circuit 101 as read data signals RDATA. The $130^{th}$-$256^{th}$ words of read data provided as signals RDATA are consecutively read from the storage locations at addresses 1-127, respectively, in storage circuit 101. The $257^{th}$ word of read data is read from the storage location at address 0 in storage circuit 101, and then this process continues to repeat. These examples are provided for illustration and are not intended to be limiting.

Write pointer generator circuit 102 also generates write pointer signals WPTRWC that indicate a write pointer. Write pointer generator circuit 102 generates the write pointer signals WPTRWC in response to the write clock signal WCK. Write pointer generator circuit 102 causes the write pointer signals WPTRWC and the write pointer indicated by the write pointer signals WPTRWC to be synchronized with the write clock signal WCK. The write pointer indicates the same write address that is concurrently indicated by the write address signals WADDR. Thus, both the write address and the write pointer indicate the address of the storage location where a word of write data was or is currently being stored in storage circuit 101. As an example, write pointer generator circuit 102 may generate the write pointer signals WPTRWC using the same counter circuit used to generate the write address signals WADDR. In an exemplary embodiment, the write address signals WADDR and the write pointer signals WPTRWC are the same signals.

The write pointer indicated by the write pointer signals WPTRWC may be, for example, encoded in binary, encoded with Gray codes, or encoded with another suitable encoding technique. The write pointer indicated by the write pointer signals WPTRWC may be encoded with the same encoding technique or with a different encoding technique relative to the write address indicated by the write address signals WADDR. As an example, the write address indicated by the write address signals WADDR may be binary encoded, and the write pointer indicated by the write pointer signals WPTRWC may be encoded using Gray codes, if WADDR and WPTRWC are two different sets of signals. As another example, both the write address indicated by the write address signals WADDR and the write pointer indicated by the write pointer signals WPTRWC may be binary encoded.

The write pointer signals WPTRWC are provided to a first set of inputs of full comparator circuit 106 and to inputs of FIFO circuit 105. FIFO circuit 105 provides the write pointer indicated by the write pointer signals WPTRWC from the write clock domain to the read clock domain. FIFO circuit 105 outputs write pointer signals WPTRRC that indicate the write pointer received from write pointer generator circuit 102. FIFO circuit 105 synchronizes the write pointer signals WPTRRC and the write pointer indicated by the write pointer signals WPTRRC with the read clock signal RCK in the read clock domain. The write pointer signals WPTRRC are provided to a first set of inputs of empty comparator 107.

Read pointer generator circuit 103 also generates read pointer signals RPTRRC that indicate a read pointer. Read pointer generator circuit 103 generates the read pointer signals RPTRRC in response to the read clock signal RCK. Read pointer generator circuit 103 causes the read pointer signals RPTRRC and the read pointer indicated by the read pointer signals RPTRRC to be synchronized with the read clock signal RCK. The read pointer indicates the same read address that is concurrently indicated by the read address signals RADDR. Thus, both the read address and the read pointer indicate the address of the storage location where a word of read data was or is currently being accessed from storage circuit 101. As an example, read pointer generator circuit 103 may generate the read pointer signals RPTRRC using the same counter circuit used to generate the read address signals RADDR. In an exemplary embodiment, the read pointer signals RPTRRC and the read address signals RADDR are the same set of signals.

The read pointer indicated by the read pointer signals RPTRRC may be, for example, binary encoded, encoded with Gray codes, or encoded with another suitable encoding technique. In some embodiments, the read pointer indicated by the read pointer signals RPTRRC is encoded using the same encoding technique as the write pointer indicated by the write pointer signals WPTRWC. For example, the read pointer and the write pointer may both be binary encoded.

The read pointer indicated by the read pointer signals RPTRRC may be encoded with the same encoding technique or with a different encoding technique relative to the read address indicated by the read address signals RADDR. As an example, the read address indicated by the read address signals RADDR may be encoded using binary encoding, and the read pointer indicated by the read pointer signals RPTRRC may be encoded using Gray codes, if RADDR and RPTRRC are different sets of signals. As another example, both the read address indicated by the read address signals RADDR and the read pointer indicated by the read pointer signals RPTRRC may be encoded using binary encoding.

The read pointer signals RPTRRC are provided to a second set of inputs of empty comparator circuit 107 and to inputs of FIFO circuit 104. FIFO circuit 104 provides the read pointer indicated by the read pointer signals RPTRRC from the read clock domain to the write clock domain. FIFO circuit 104 outputs read pointer signals RPTRWC that indicate the read pointer received from read pointer generator circuit 103. FIFO circuit 104 synchronizes the read pointer signals RPTRWC and the read pointer indicated by the read pointer signals RPTRWC with the write clock signal WCK in the write clock domain. The read pointer signals RPTRWC are provided to a second set of inputs of full comparator circuit 106.

In some embodiments, the write pointer signals WPTRWC include one or more additional bits relative to the write address signals WADDR, and the read pointer signals RPTRRC include one or more additional bits relative to the read address signals RADDR. The additional bits in the read and write pointer signals can be used to differentiate when storage circuit 101 is full of words of data and when storage circuit 101 is empty such that storage circuit 101 is not storing at least one full word of data.

If storage circuit 101 stores a new word of write data at a storage location before the word of data previously stored at that storage location has been accessed from storage circuit 101 and output as read data, the previously stored word of data will be overwritten by the new word of write data and will be lost. Loss of data words may occur when FIFO circuit 100 is full of data words such that the process of writing new words of data to storage circuit 101 catches up with the process of reading words of data stored in storage circuit 101. Thus, if storage circuit 101 has exactly an N number of storage locations, and an N number of words of data have been stored in storage circuit 101, but none of the N number of words of data have been read from storage circuit 101, loss of data may occur when the next word of write data is stored in storage circuit 101.

In order to prevent loss of data that may occur when FIFO circuit 100 is full, FIFO circuit 100 includes full comparator circuit 106. Full comparator circuit 106 compares the read pointer indicated by the read pointer signals RPTRWC to the write pointer indicated by the write pointer signals WPTRWC in the write clock domain to generate an output signal FULL. The FULL output signal of full comparator circuit 106 indicates when storage circuit 101 is full and there is a risk of overwriting and losing words of data stored in storage circuit 101 that have not yet been output as read data from storage circuit 101. As an example, full comparator circuit 106 may assert its FULL output signal to indicate that storage circuit 101 is full when the write pointer indicated by the write pointer signals WPTRWC equals the read pointer indicated by the read pointer signals RPTRWC.

If storage circuit 101 attempts to read a word of data from one of its storage locations before all of the bits in that word of data have been stored in that storage location, storage circuit 101 may output values for the read data signals RDATA that do not correctly and completely indicate that word of data. Storage circuit 101 is effectively empty when storage circuit 101 does not store at least one full word of unread data. Storage circuit 101 may generate incorrect values for the read data signals RDATA when storage circuit 101 attempts to write a word of data to and read a word of data from the same one of its storage locations at the same time.

In order to prevent storage circuit 101 from generating incorrect values for the read data signals RDATA when storage circuit 101 is empty, FIFO circuit 100 includes empty comparator circuit 107. Empty comparator circuit 107 compares the read pointer indicated by the read pointer signals RPTRRC to the write pointer indicated by the write pointer signals WPTRRC in the read clock domain to generate an output signal EMPTY. The output signal EMPTY of empty comparator circuit 107 indicates when storage circuit 101 is empty, such that storage circuit 101 does not store at least one full word of unread data. As an example, empty comparator circuit 107 may assert its EMPTY output signal to indicate that storage circuit 101 is empty when the write pointer indicated by the write pointer signals WPTRRC equals the read pointer indicated by the read pointer signals RPTRRC.

According to further embodiments, FIFO circuit 100 may have additional circuitry that performs other functions using the read and write pointers. For example, FIFO circuit 100 may include circuitry that subtracts the write pointer from the read pointer to determine how many words stored in storage circuit 101 have not yet been read from storage circuit 101. The write pointer may be subtracted from the read pointer in the read clock domain or in the write clock domain. In general, circuits performing arithmetic functions using the read and write pointers are less complex if the read and write pointers are both binary encoded. In some embodiments of FIFO circuit 100, the read and write pointers are binary encoded. The read and write pointers may include additional bits to indicate when reading and writing, respectively, has moved from the last storage location in storage circuit 101 back to the first storage location in storage circuit 101. According to other embodiments, FIFO circuit 100 may generate pointers that indicate when storage circuit 101 is partially full and when storage circuit 101 is partially empty.

Figure 2:
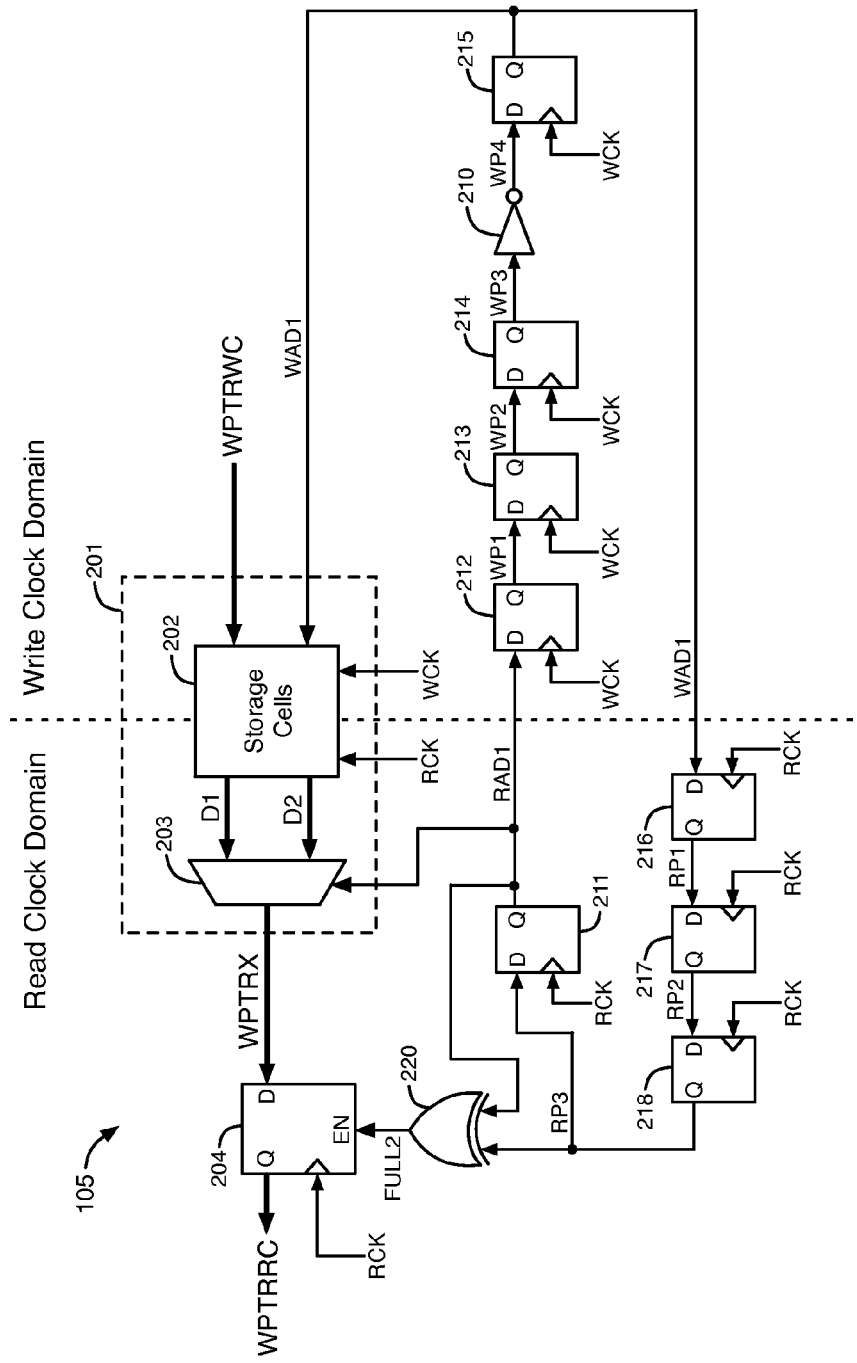
FIG. 2 illustrates an example of a component first-in first-out (FIFO) circuit in the FIFO circuit of FIG. 1 that synchronizes the write pointer with the read clock signal, according to an embodiment of the present invention.

FIG. 2 illustrates an example of first-in first-out (FIFO) circuit 105, according to an embodiment of the present invention. FIFO circuit 105 includes storage circuit 201, D flip-flop circuits 204, D flip-flop circuits 211-218, inverter circuit 210, and XOR logic gate circuit 220. Storage circuit 201 includes storage cells 202 and multiplexer circuit 203. The architecture of FIFO circuit 105 shown in FIG. 2 is merely one example of FIFO circuit 105. In other embodiments, other suitable FIFO architectures for FIFO circuit 105 may be used in FIFO circuit 100.

Storage circuit 201 may be any suitable type of storage circuit. For example, storage circuit 201 may include random access memory (RAM) such as static RAM or dynamic RAM, register circuits such as flip-flop circuits, or both. Each storage location in storage circuit 201 may include, for example, multiple RAM cells or register circuits that can store a word of data. As another example, storage circuit 201 may include flash memory or another type of non-volatile memory.

Storage circuit 201 includes at least two storage locations in storage cells 202. In some embodiments, storage circuit 201 includes only two storage locations. Each of the two storage locations in storage cells 202 can store one word of data. Thus, storage circuit 201 can store two words of data in two different storage locations.

The read clock signal RCK is provided to the clock inputs of flip-flop circuits 211 and 216-218 in the read clock domain. The write clock signal WCK is provided to the clock inputs of flip-flop circuits 212-215 in the write clock domain. Flip-flop circuit 211 generates a read address signal RAD1 at its Q output. Read address signal RAD1 is provided to the select input of multiplexer circuit 203, to the first input of XOR logic gate circuit 220, and to the D input of flip-flop circuit 212.

Flip-flop circuits 212-214 are metastability harden registers that convert the value of the read address signal RAD1 from the read clock domain to the write clock domain. Flip-flop circuit 212 stores the value of the read address signal RAD1 at its Q output as signal WP1 in response to the write clock signal WCK. Signal WP1 is provided to the D input of flip-flop circuit 213. Flip-flop circuit 213 stores the value of signal WP1 at its Q output as signal WP2 in response to the write clock signal WCK. Signal WP2 is provided to the D input of flip-flop circuit 214. Flip-flop circuit 214 stores the value of signal WP2 at its Q output as signal WP3 in response to the write clock signal WCK.

Inverter circuit 210 inverts the digital value of signal WP3 to generate an inverted digital value for signal WP4 at its output. Inverter circuit 210 may be, for example, a CMOS inverter. Signal WP4 is provided to the D input of flip-flop circuit 215. Flip-flop circuit 215 stores the value of signal WP4 at its Q output as a write address signal WAD1 in response to the write clock signal WCK. Flip-flop circuits 212-215 may, for example, transfer the values of their respective input signals to their respective Q outputs at each rising edge (or at each falling edge) of clock signal WCK. Write address signal WAD1 is provided to the D input of flip-flop circuit 216 and to the write address input of storage cells 202.

Flip-flop circuits 216-218 are metastability harden registers that convert the value of the write address signal WAD1 from the write clock domain to the read clock domain. Flip-flop circuit 216 stores the value of the write address signal WAD1 at its Q output as signal RP1 in response to the read clock signal RCK. Signal RP1 is provided to the D input of flip-flop circuit 217. Flip-flop circuit 217 stores the value of signal RP1 at its Q output as signal RP2 in response to the read clock signal RCK. Signal RP2 is provided to the D input of flip-flop circuit 218. Flip-flop circuit 218 stores the value of signal RP2 at its Q output as signal RP3 in response to the read clock signal RCK. Signal RP3 is provided to a second input of XOR logic gate circuit 220 and to the D input of flip-flop circuit 211. Flip-flop circuit 211 stores the value of signal RP3 at its Q output as read address signal RAD1 in response to the read clock signal RCK. Flip-flop circuits 211 and 216-218 may, for example, transfer the values of their respective input signals to their respective Q outputs at each rising edge (or at each falling edge) of clock signal RCK.

Flip-flop circuits 211-218 and inverter circuit 210 are coupled as a loop circuit that generates continuously toggling digital values for the read address signal RAD1 and for the write address signal WAD1. For example, if signal RAD1 is in a logic low state, the logic low state value of signal RAD1 propagates through metastability harden registers 212-214 to inverter circuit 210. Inverter circuit 210 inverts the logic low state in signal WP3 to generate a logic high state in signal WP4, which then propagates through flip-flop circuit 215 to write address signal WAD1.

The logic high state of write address signal WAD1 then propagates through metastability harden registers 216-218 and flip-flop circuit 211 to cause read address signal RAD1 to transition to a logic high state. The logic high state in read address signal RAD1 then propagates through registers 212-214 to inverter circuit 210. Inverter circuit 210 inverts the logic high state in signal WP3 to generate a logic low state in signal WP4, which then propagates through flip-flop circuit 215 to write address signal WAD1. The logic low state of write address signal WAD1 then propagates through registers 216-218 and flip-flop circuit 211 to cause read address signal RAD1 to transition back to a logic low state. This process of oscillation continues to repeat during the operation of FIFO circuit 105 to generate continuously toggling digital values for signals RAD1 and WAD1.

The write pointer signals WPTRWC that indicate the write pointer in the write clock domain are provided to the write data inputs of storage cells 202 in storage circuit 201. Write address signal WAD1 is provided to the write address input of storage cells 202. When the write address signal WAD1 is in a logic high state, the write pointer indicated by the write pointer signals WPTRWC is stored in the first storage location in storage cells 202 in response to write clock signal WCK. The write pointer stored in the first storage location in storage cells 202 is provided to a first set of multiplexing inputs of multiplexer circuit 203 as signals D1 in response to read clock signal RCK. When the read address signal RAD1 is in a logic high state, multiplexer circuit 203 provides the write pointer indicated by signals D1 to its outputs as write pointer signals WPTRX.

When the write address signal WAD1 is in a logic low state, the write pointer indicated by the write pointer signals WPTRWC is stored in the second storage location in storage cells 202 in response to write clock signal WCK. The write pointer stored in the second storage location in storage cells 202 is provided to a second set of multiplexing inputs of multiplexer circuit 203 as signals D2 in response to read clock signal RCK. When the read address signal RAD1 is in a logic low state, multiplexer circuit 203 provides the write pointer indicated by signals D2 to its outputs as write pointer signals WPTRX. The write pointers are read from storage circuit 201 in the same order that the write pointers are stored in storage circuit 201. In some embodiments, some of the write pointers stored in storage circuit 201 may be overwritten before they are read from storage circuit 201, as described in further detail below.

XOR logic gate circuit 220 performs an XOR Boolean logic function on signals RAD1 and RP3 to generate its output signal FULL2. XOR logic gate circuit 220 causes the FULL2 signal to be in a logic high state when signals RAD1 and RP3 have different logic states. XOR logic gate circuit 220 causes the FULL2 signal to be in a logic low state when signals RAD1 and RP3 have the same logic states.

Flip-flop circuits 204 include multiple D flip-flop circuits. Flip-flop circuits 204 are shown as one box in FIG. 2 to simplify the drawing. In an embodiment, the number of flip-flop circuits 204 equals the number of write pointer signals WPTRX. Each of the write pointer signals WPTRX is provided to the D input of a different one of the flip-flip circuits 204. The read clock signal RCK is provided to the clock input of each of the flip-flop circuits 204. The FULL2 output signal of XOR logic gate circuit 220 is provided to an enable (EN) input of each of the flip-flop circuits 204.

Flip-flop circuits 204 generate the write pointer signals WPTRRC at their Q outputs. When the FULL2 output signal of XOR logic gate circuit 220 is in a logic high state, flip-flop circuits 204 provide the write pointer indicated by write pointer signals WPTRX to their Q outputs as signals WPTRRC in response to the read clock signal RCK. Thus, the write pointer signals WPTRRC are updated to indicate the same write pointer that is indicated by signals WPTRX when signal FULL2 is in a logic high state.

When the FULL2 output signal of XOR logic gate circuit 220 is in a logic low state, flip-flop circuits 204 maintain the write pointer signals WPTRRC at their Q outputs at constant values. Flip-flop circuits 204 do not provide updated values of signals WPTRX to their Q outputs in signals WPTRRC when the FULL2 signal is in a logic low state, regardless of the state of clock signal RCK.

When a new write pointer indicated by the write pointer signals WPTRWC is being stored in the first storage location in storage cells 202, FIFO circuit 105 accesses and outputs the write pointer previously stored in the second storage location in storage cells 202. The next write pointer indicated by the write pointer signals WPTRWC is stored in the second storage location in storage cells 202. When the next write pointer indicated by the write pointer signals WPTRWC is being stored in the second storage location in storage cells 202, FIFO circuit 105 accesses and outputs the write pointer previously stored in the first storage location in storage cells 202. The next write pointer indicated by the write pointer signals WPTRWC is stored in the first storage location in storage cells 202. During the operation of FIFO circuit 100, FIFO circuit 105 continues to toggle between writing write pointers to and reading the write pointers from the first and second storage locations in storage cells 202.

Flip-flop circuits 216-218 and 211 provide enough delay to ensure that a write pointer indicated by signals WPTRWC is completely stored in one of the storage locations in storage cells 202 before that write pointer is accessed from storage cells 202. Flip-flop circuits 212-215 provide enough delay to ensure that a write pointer being accessed from storage cells 202 is provided to the Q outputs of flip-flop circuits 204 as signals WPTRRC before that write pointer is partially overwritten by a subsequent write pointer indicated by signals WPTRWC. Thus, flip-flop circuits 211-218 and inverter circuit 210 prevent FIFO circuit 105 from attempting to read from and write to the same storage location in storage cells 202 at the same time.

If the write clock signal WCK has a significantly greater frequency than the read clock signal RCK, a newer write pointer may be stored in a storage location in storage cells 202 before an older write pointer is accessed from that same storage location and provided to the Q outputs of flip-flop circuits 204. Thus, an older write pointer may be overwritten by a newer write pointer and lost before the older write pointer is read out of storage cells 202. However, FIFO circuit 100 does not malfunction as a result of FIFO circuit 105 losing one or more write pointers indicated by write pointer signals WPTRWC. After reading a write pointer from storage circuit 201, FIFO circuit 105 provides that write pointer to comparator circuit 107 in signals WPTRRC. Providing a more recently generated write pointer to comparator circuit 107 allows comparator circuit 107 to generate a more accurate value of the EMPTY signal.

In FIFO circuit 105, the read address signal RAD1 for storage circuit 201 is only one signal that represents a single bit and the write address signal WAD1 for storage circuit 201 is only one signal that represents a single bit. Because signals RAD1 and WAD1 each have only one signal representing a single bit, FIFO circuit 105 eliminates potential problems caused by skew between multiple parallel signals that indicate a pointer to an address in a storage circuit. As a result, the timing, placement, and routing constraints for the signals in FIG. 2 can be relaxed in some embodiments (e.g., in an FPGA). As mentioned above, skew between multiple parallel signals that indicate a pointer may cause an incorrect value of the pointer to be generated as the pointer is transmitted between the read and the write clock domains.

Figure 3:
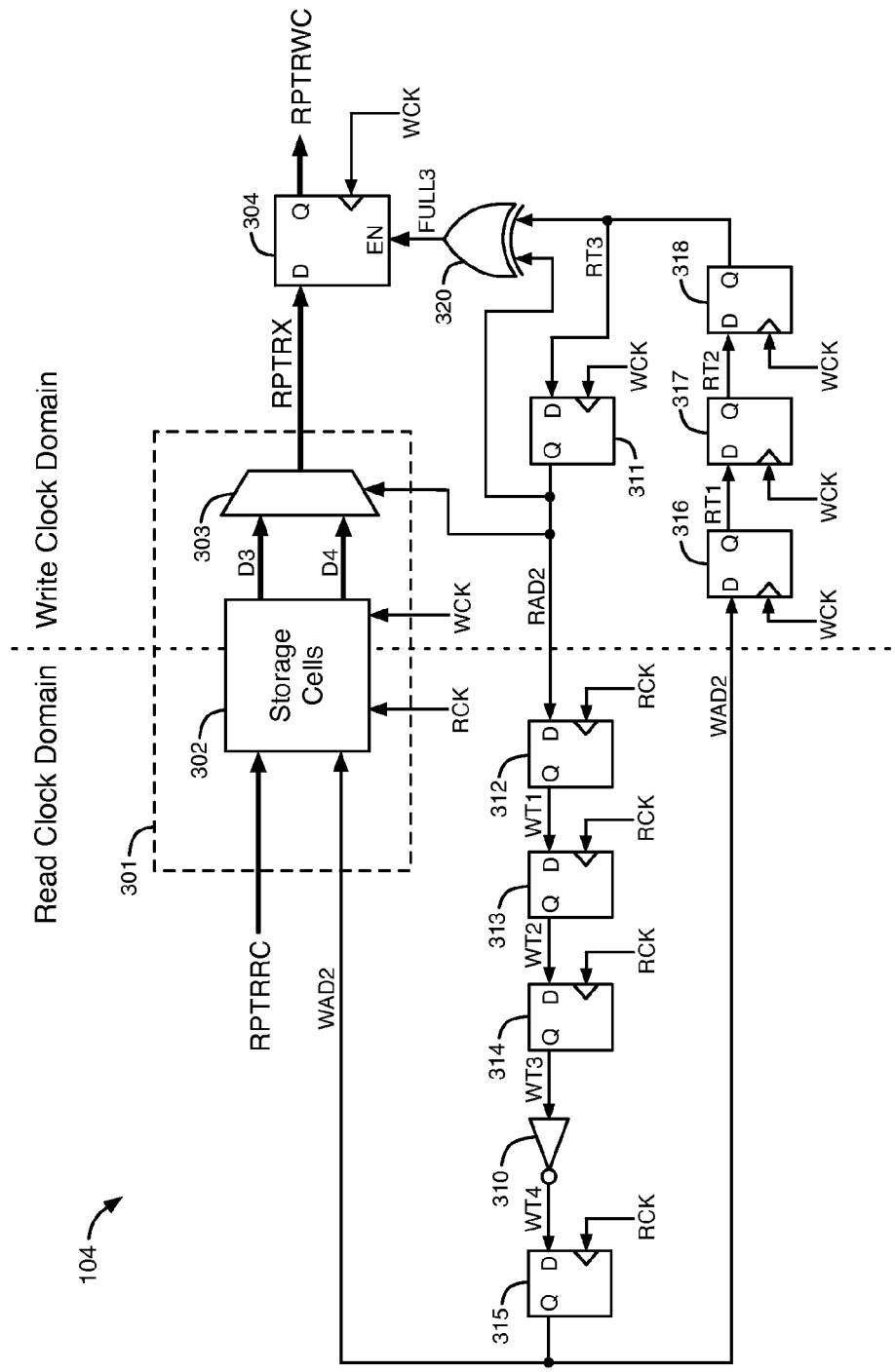
FIG. 3 illustrates an example of another component first-in first-out (FIFO) circuit in the FIFO circuit of FIG. 1 that synchronizes the read pointer with the write clock signal, according to an embodiment of the present invention.

FIG. 3 illustrates an example of first-in first-out (FIFO) circuit 104, according to an embodiment of the present invention. FIFO circuit 104 includes storage circuit 301, D flip-flop circuits 304, D flip-flop circuits 311-318, inverter circuit 310, and XOR logic gate circuit 320. Storage circuit 301 includes storage cells 302 and multiplexer circuit 303. The architecture of FIFO circuit 104 shown in FIG. 3 is merely one example of FIFO circuit 104. In alternative embodiments, other suitable FIFO architectures for FIFO circuit 104 may be used in FIFO circuit 100.

Storage circuit 301 may be any suitable type of storage circuit. For example, storage circuit 301 may include random access memory (RAM), register circuits such as flip-flop circuits, or both. Each storage location in storage circuit 301 may include, for example, multiple RAM cells or register circuits that can store a word of data. As another example, storage circuit 301 may include flash memory or another type of non-volatile memory.

Storage circuit 301 includes at least two storage locations in storage cells 302. In some embodiments, storage circuit 301 includes only two storage locations in storage cells 302.

Each of the two storage locations in storage cells 302 can store one word of data. Thus, storage cells 302 can store at least two words of data.

The read clock signal RCK is provided to the clock inputs of flip-flop circuits 312-315 in the read clock domain. The write clock signal WCK is provided to the clock inputs of flip-flop circuits 311 and 316-318 in the write clock domain. Flip-flop circuit 311 generates a read address signal RAD2 at its Q output. Read address signal RAD2 is provided to the select input of multiplexer circuit 303, to the first input of XOR logic gate circuit 320, and to the D input of flip-flop circuit 312.

Flip-flop circuits 312-314 are metastability harden registers that convert the value of the read address signal RAD2 from the write clock domain to the read clock domain. Flip-flop circuit 312 stores the value of the read address signal RAD2 at its Q output as signal WT1 in response to the read clock signal RCK. Signal WT1 is provided to the D input of flip-flop circuit 313. Flip-flop circuit 313 stores the value of signal WT1 at its Q output as signal WT2 in response to the read clock signal RCK. Signal WT2 is provided to the D input of flip-flop circuit 314. Flip-flop circuit 314 stores the value of signal WT2 at its Q output as signal WT3 in response to the read clock signal RCK.

Inverter circuit 310 inverts the digital value of signal WT3 to generate an inverted digital value for signal WT4 at its output. Inverter circuit 310 may be, for example, a CMOS inverter. Signal WT4 is provided to the D input of flip-flop circuit 315. Flip-flop circuit 315 stores the value of signal WT4 at its Q output as a write address signal WAD2 in response to the read clock signal RCK. Flip-flop circuits 312-315 may, for example, transfer the values of their respective input signals to their respective Q outputs at each rising edge (or at each falling edge) of clock signal RCK. Write address signal WAD2 is provided to the D input of flip-flop circuit 316 and to the write address input of storage cells 302.

Flip-flop circuits 311-318 and inverter circuit 310 are coupled as a loop circuit that generates continuously toggling digital values for the read address signal RAD2 and for the write address signal WAD2. After inverter circuit 310 generates a logic high state at its output in signal WT4, the logic high state propagates through flip-flop circuit 315 to signal WAD2. The logic high state then propagates through flip-flop circuits 316-318 and 311 to signal RAD2. The logic high state then propagates through flip-flop circuits 312-314 to signal WT3 at the input of inverter circuit 310.

Inverter circuit 310 then generates a logic low state in signal WT4 in response to the logic high state in signal WT3. The logic low state then propagates through flip-flop circuit 315 to signal WAD2. The logic low state then propagates through flip-flop circuits 316-318 and 311 to signal RAD2. The logic low state then propagates through flip-flop circuits 312-314 to signal WT3. In response to receiving a logic low state in signal WT3, inverter circuit 310 drives signal WT4 back to a logic high state. This process continues to repeat during the operation of FIFO circuit 104 to generate continuously toggling digital values for signals RAD2 and WAD2.

The read pointer signals RPTRRC that indicate a read pointer in the read clock domain are provided to the write data inputs of storage cells 302 in storage circuit 301. Write address signal WAD2 is provided to the write address input of storage cells 302. When the write address signal WAD2 is in a logic high state, the read pointer indicated by the read pointer signals RPTRRC is stored in the first storage location in storage cells 302 in response to the read clock signal RCK. The read pointer stored in the first storage location in storage cells 302 is provided to a first set of multiplexing inputs of multiplexer circuit 303 as signals D3 in response to write clock signal WCK. When the read address signal RAD2 is in a logic high state, multiplexer circuit 303 provides the read pointer indicated by signals D3 to its outputs as read pointer signals RPTRX.

When the write address signal WAD2 is in a logic low state, the read pointer indicated by the read pointer signals RPTRRC is stored in the second storage location in storage cells 302 in response to the read clock signal RCK. The read pointer stored in the second storage location in storage cells 302 is provided to a second set of multiplexing inputs of multiplexer circuit 303 as signals D4 in response to write clock signal WCK. When the read address signal RAD2 is in a logic low state, multiplexer circuit 303 provides the read pointer indicated by signals D4 to its outputs as read pointer signals RPTRX. The read pointers are read from storage circuit 301 in the same order that the read pointers are stored in storage circuit 301. In some embodiments, some of the read pointers that are stored in storage circuit 301 may be overwritten before they are read from storage circuit 301.

XOR logic gate circuit 320 performs an XOR Boolean logic function on signals RAD2 and RT3 to generate its output signal FULL3. XOR logic gate circuit 320 causes the FULL3 signal to be in a logic high state when signals RAD2 and RT3 have different logic states. XOR logic gate circuit 320 causes the FULL3 signal to be in a logic low state when signals RAD2 and RT3 have the same logic states.

Flip-flop circuits 304 include multiple D flip-flop circuits. Flip-flop circuits 304 are shown as one box in FIG. 3 to simplify the drawing. The number of flip-flop circuits 304 equals the number of read pointer signals RPTRX. Each of the read pointer signals RPTRX is provided to the D input of a different one of the flip-flip circuits 304. The write clock signal WCK is provided to the clock input of each of the flip-flop circuits 304. The FULL3 output signal of XOR logic gate circuit 320 is provided to an enable (EN) input of each of the flip-flop circuits 304.

Flip-flop circuits 304 generate the read pointer signals RPTRWC at their Q outputs. When the FULL3 output signal of XOR logic gate circuit 320 is in a logic high state, flip-flop circuits 304 provide the read pointer indicated by read pointer signals RPTRX to their Q outputs as signals RPTRWC in response to the write clock signal WCK. Thus, the read pointer that is indicated by signals RPTRX is transferred to the read pointer signals RPTRWC when signal FULL3 is in a logic high state.

When the FULL3 output signal of XOR logic gate circuit 320 is in a logic low state, flip-flop circuits 304 maintain the read pointer signals RPTRWC at their Q outputs at constant values. Flip-flop circuits 304 do not provide updated values of signals RPTRX to their Q outputs in signals RPTRWC when the FULL3 signal is in a logic low state, regardless of the state of clock signal WCK.

When a new read pointer indicated by read pointer signals RPTRRC is being stored in the first storage location in storage cells 302, FIFO circuit 104 accesses and outputs the read pointer previously stored in the second storage location in storage cells 302. The next read pointer indicated by the read pointer signals RPTRRC is stored in the second storage location in storage cells 302. When the next read pointer indicated by the read pointer signals RPTRRC is being stored in the second storage location in storage cells 302, FIFO circuit 104 accesses and outputs the read pointer stored in the first storage location in storage cells 302. The next read pointer indicated by the read pointer signals RPTRRC is stored in the first storage location in storage cells 302. During the operation of FIFO circuit 100, FIFO circuit 104 continues to toggle between writing read pointers to and reading the read pointers from the first and second storage locations in storage cells 302. Flip-flop circuits 311-318 and inverter circuit 310 prevent FIFO circuit 104 from attempting to read from and write to the same storage location in storage cells 302 at the same time.

In FIFO circuit 104, the read address signal RAD2 for storage circuit 301 is only one signal that represents a single bit and the write address signal WAD2 for storage circuit 301 is only one signal that represents a single bit. Because signals RAD2 and WAD2 each have only one signal representing a single bit, FIFO circuit 104 eliminates potential problems caused by skew between multiple parallel signals that indicate a pointer to an address in a storage circuit. As a result, the timing, placement, and routing constraints for the signals in FIG. 3 can be relaxed in some embodiments (e.g., in an FPGA).

According to an alternative embodiment, the circuitry in FIFO circuit 104 has the circuit structure shown in FIG. 1, and the circuitry in FIFO circuit 105 has the circuit structure shown in FIG. 1. In this embodiment, a second storage circuit 101, a second write pointer generator circuit 102, a second read pointer generator circuit 103, a second FIFO circuit 104, a second FIFO circuit 105, a second full comparator 106, and a second empty comparator 107 are inside the first and largest FIFO circuit 104 in FIFO circuit 100. In the first FIFO circuit 104, the read pointer signals RPTRRC are provided to the WD inputs of the second storage circuit 101, and the read pointer signals RPTRWC are generated at the RD outputs of the second storage circuit 101. Within the first FIFO circuit 104, the read clock signal is swapped with the write clock signal, and the write clock signal is swapped with the read clock signal, relative to the clock signals shown in FIG. 1. Thus, the second storage circuit 101 stores the read pointer indicated by the read pointer signals RPTRRC in response to the read clock signal RCK and outputs a stored read pointer as its RD outputs in response to the write clock signal WCK.

Also, in this embodiment, a third storage circuit 101, a third write pointer generator circuit 102, a third read pointer generator circuit 103, a third FIFO circuit 104, a third FIFO circuit 105, a third full comparator 106, and a third empty comparator 107 are inside the first and largest FIFO circuit 105 in FIFO circuit 100. Each of the second FIFO circuit 104 and the third FIFO circuit 104 has the circuitry that is shown in FIG. 3 for FIFO circuit 104 in this embodiment. Each of the second FIFO circuit 105 and the third FIFO circuit 105 has the circuitry that is shown in FIG. 2 for FIFO circuit 105 in this embodiment. In the first FIFO circuit 105, the write pointer signals WPTRWC are provided to the WD inputs of the third storage circuit 101, and the write pointer signals WPTRRC are generated at the RD outputs of the third storage circuit 101. In the first FIFO circuit 105, the read and write clock signals clock the circuits as shown in FIG. 1.

According to another alternative embodiment, each of the second FIFO circuit 104, the third FIFO circuit 104, the second FIFO circuit 105, and the third FIFO circuit 105 has the same circuit structure that is shown in FIG. 1. In this embodiment, FIFO circuit 100 has three levels, with the first and second levels of FIFO circuit 100 having the circuit structure shown in FIG. 1 within each of FIFO circuits 104 and 105. The FIFO circuits 104 and 105 in the third level have the circuit structures shown in FIGS. 3 and 2, respectively. According to a further embodiment, each of the FIFO circuits 104 and 105 in the third level of FIFO circuit 100 has the circuit structure shown in FIG. 1 to create four levels of FIFO circuit 100. According to additional recursive embodiments, FIFO circuit 100 may have any number of levels.

Figure 4:
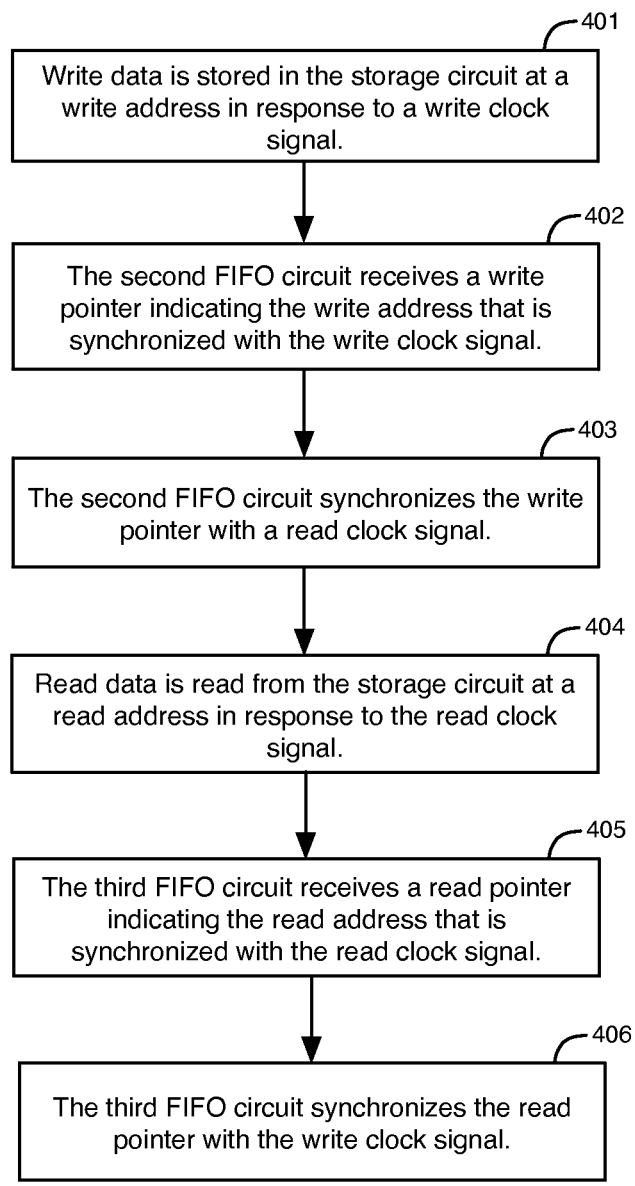
FIG. 4 is a flow chart that illustrates examples of operations performed by a FIFO circuit, according to an embodiment of the present invention.

FIG. 4 is a flow chart that illustrates examples of operations performed by a FIFO circuit, according to an embodiment of the present invention. A first first-in first-out (FIFO) circuit includes a storage circuit, a second first-in first-out (FIFO) circuit, and a third first-in first-out (FIFO) circuit, as shown, for example, in FIG. 1. In operation 401, write data is stored in the storage circuit at a write address in response to a write clock signal. In operation 402, the second FIFO circuit receives a write pointer indicating the write address that is synchronized with the write clock signal. In operation 403, the second FIFO circuit synchronizes the write pointer with a read clock signal. In operation 404, read data is read from the storage circuit at a read address in response to the read clock signal. In operation 405, the third FIFO circuit receives a read pointer indicating the read address that is synchronized with the read clock signal. In operation 406, the third FIFO circuit synchronizes the read pointer with the write clock signal.

According to an embodiment, a first first-in first-out (FIFO) circuit includes a storage circuit, a second first-in first-out (FIFO) circuit, and a third first-in first-out (FIFO) circuit.

According to a further embodiment, a first first-in first-out (FIFO) circuit includes a storage circuit to store write data at a write address in response to a write clock signal in a write clock domain. The storage circuit provides read data from a read address in response to a read clock signal in a read clock domain. A write pointer indicating the write address is synchronized with the write clock signal. A read pointer indicating the read address is synchronized with the read clock signal. The first FIFO circuit also includes a second first-in first-out (FIFO) circuit to transfer one of the write pointer or the read pointer between the read and the write clock domains.

Figure 5:
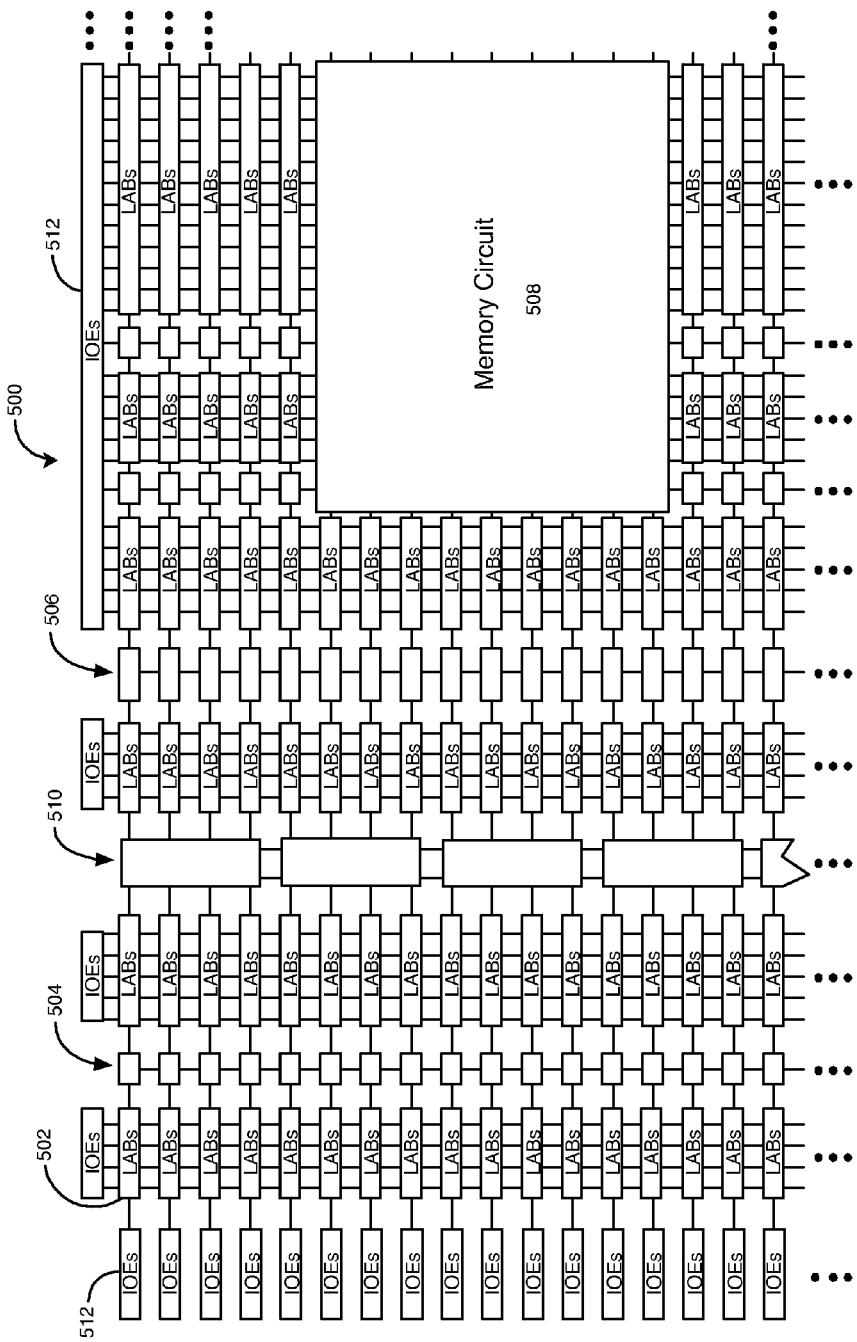
FIG. 5 is a simplified partial block diagram of a field programmable gate array (FPGA) that can include aspects of the present invention.

FIG. 5 is a simplified partial block diagram of a field programmable gate array (FPGA) 500 that can include aspects of the present invention. FPGA 500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 500 includes a two-dimensional array of programmable logic array blocks (or LABs) 502 that are interconnected by a network of column and row interconnect conductors of varying length and speed. LABs 502 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of interconnect conductors. The programmable interconnect structure can be programmed to interconnect the logic elements in almost any desired configuration.

FPGA 500 may also include a distributed memory structure including random access memory (RAM) circuits of varying sizes provided throughout the array. The RAM circuits include, for example, circuits 504, circuits 506, and circuit 508. These memory circuits can also include shift registers and first-in first-out (FIFO) circuits, such as FIFO circuit 100.

FPGA 500 may further include digital signal processing (DSP) circuits 510 that can implement, for example, multipliers with add or subtract features. Input/output elements (IOEs) 512 support numerous single-ended and differential input/output standards. IOEs 512 may include input and output buffers that are coupled to pins of the integrated circuit. The pins are external terminals of the FPGA die that can be used to route, for example, input signals, output signals, and supply voltages between the FPGA and one or more external devices. FPGA 500 is described herein for illustrative purposes. Embodiments of the present invention can be implemented in many different types of integrated circuits.

Figure 6:
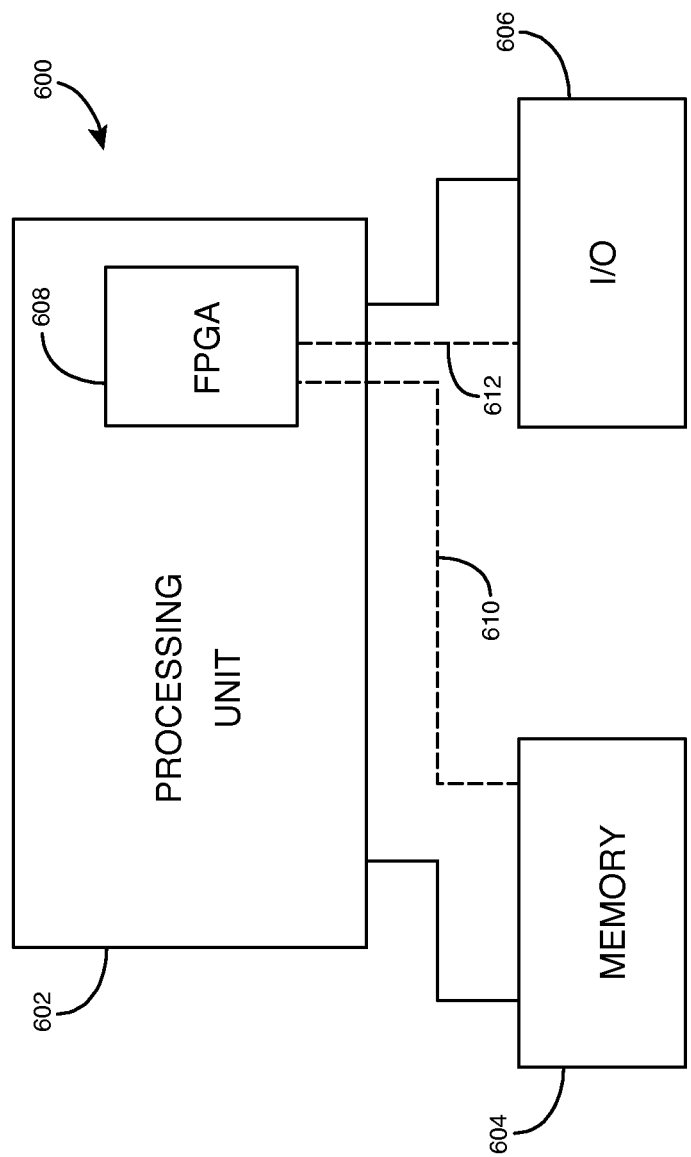
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604, and an input/output (I/O) unit 606 interconnected together by one or more buses. According to this exemplary embodiment, an FPGA 608 is embedded in processing unit 602. FPGA 608 can serve many different purposes within the system of FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604, receive and transmit data via I/O unit 606, or other similar functions. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor that can be reprogrammed as needed to handle a particular computing task. Alternatively, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A first first-in first-out circuit comprising:
a first storage circuit to store write data at a write address in response to a write clock signal, the first storage circuit to output read data from a read address in response to a read clock signal, wherein a write pointer indicating the write address is synchronized with the write clock signal, and wherein a read pointer indicating the read address is synchronized with the read clock signal;
a second first-in first-out circuit to synchronize the write pointer with the read clock signal, wherein the second first-in first-out circuit comprises:
a first loop circuit to generate a first read address signal and a first write address signal, and
a second storage circuit to store the write pointer at a first storage location indicated by the first write address signal and to read the write pointer from the first storage location based on the first read address signal; and
a third first-in first-out circuit to synchronize the read pointer with the write clock signal.

2. The first first-in first-out circuit of claim 1 further comprising:
a first comparator circuit to generate a first comparison signal based on a comparison between the write pointer synchronized with the write clock signal and the read pointer synchronized with the write clock signal; and
a second comparator circuit to generate a second comparison signal based on a comparison between the read pointer synchronized with the read clock signal and the write pointer synchronized with the read clock signal.

3. The first first-in first-out circuit of claim 1, wherein the first loop circuit comprises first metastability harden register circuits and an inverter circuit to generate the first write address signal based on the first read address signal, and wherein the first loop circuit further comprises second metastability harden register circuits to generate the first read address signal based on the first write address signal.

4. The first first-in first-out circuit of claim 3, wherein the second first-in first-out circuit further comprises:
a logic gate circuit to generate an output signal based on the first read address signal; and
flip-flop circuits to store the write pointer read from the second storage circuit when the flip-flop circuits are enabled by the output signal of the logic gate circuit.

5. The first first-in first-out circuit of claim 1, wherein the third first-in first-out circuit comprises:
a second loop circuit to generate a second read address signal and a second write address signal; and
a third storage circuit to store the read pointer at a second storage location indicated by the second write address signal and to read the read pointer from the second storage location based on the second read address signal.

6. The first first-in first-out circuit of claim 5, wherein the second loop circuit comprises first metastability harden register circuits and an inverter circuit to generate the second write address signal based on the second read address signal, and wherein the second loop circuit further comprises second metastability harden register circuits to generate the second read address signal based on the second write address signal.

7. The first first-in first-out circuit of claim 6, wherein the third first-in first-out circuit further comprises:
a logic gate circuit to generate an output signal based on the second read address signal and based on a second signal generated by the second metastability harden register circuits; and flip-flop circuits to store the read pointer read from the third storage circuit when the flip-flop circuits are enabled by the output signal of the logic gate circuit.

8. The first first-in first-out circuit of claim 1 further comprising:
a write pointer generator circuit to generate the write pointer; and
a read pointer generator circuit to generate the read pointer.

9. The first first-in first-out circuit of claim 1, wherein the second first-in first-out circuit comprises a fourth first-in first-out circuit, and wherein the third first-in first-out circuit comprises a fifth first-in first-out circuit.

10. A circuit comprising:
a first storage circuit to store words of write data at write addresses in response to a write clock signal, the first storage circuit to access words of read data from read addresses in response to a read clock signal, wherein the words of read data are read from the first storage circuit in the same order that the words of write data were stored in the first storage circuit, wherein write pointers indicating the write addresses are synchronized with the write clock signal, and wherein read pointers indicating the read addresses are synchronized with the read clock signal;
a second storage circuit to synchronize the write pointers with the read clock signal, wherein the write pointers are read from the second storage circuit in the same order that the write pointers are stored in the second storage circuit;
a first loop circuit to generate a first read address signal and a first write address signal, wherein the second storage circuit stores the write pointers at first storage locations indicated by the first write address signal and accesses the write pointers from the first storage locations based on the first read address signal; and
a third storage circuit to synchronize the read pointers with the write clock signal, wherein the read pointers are read from the third storage circuit in the same order that the read pointers are stored in the third storage circuit.

11. The circuit of claim 10 further comprising:
a first comparator circuit to generate a first comparison signal based on a comparison between the write pointers synchronized with the write clock signal and the read pointers synchronized with the write clock signal;
a second comparator circuit to generate a second comparison signal based on a comparison between the read pointers synchronized with the read clock signal and the write pointers synchronized with the read clock signal;
a write pointer generator circuit to generate the write pointers in response to the write clock signal; and
a read pointer generator circuit to generate the read pointers in response to the read clock signal.

12. The circuit of claim 10 further comprising:
a second loop circuit to generate a second read address signal and a second write address signal,
wherein the third storage circuit stores the read pointers at second storage locations indicated by the second write address signal and accesses the read pointers from the second storage locations based on the second read address signal.

13. The circuit of claim 12, wherein the first loop circuit comprises first metastability harden register circuits and a first inverter circuit to generate the first write address signal based on the first read address signal, wherein the first loop circuit further comprises second metastability harden register circuits to generate the first read address signal based on the first write address signal,
wherein the second loop circuit comprises third metastability harden register circuits and a second inverter circuit to generate the second write address signal based on the second read address signal, and wherein the second loop circuit further comprises fourth metastability harden register circuits to generate the second read address signal based on the second write address signal.

14. A method comprising:
storing write data in a first storage circuit at a write address in response to a write clock signal, wherein the first storage circuit is part of a first first-in first-out circuit;
receiving a write pointer indicating the write address that is synchronized with the write clock signal;
synchronizing the write pointer with a read clock signal using a second first-in first-out circuit that is part of the first first-in first-out circuit;
reading read data from the first storage circuit at a read address in response to the read clock signal;
receiving a read pointer indicating the read address that is synchronized with the read clock signal; and
synchronizing the read pointer with the write clock signal using a third first-in first-out circuit that is part of the first first-in first-out circuit by:
generating a first read address signal and a first write address signal using a first loop circuit,
storing the read pointer at a first storage location in a second storage circuit indicated by the first write address signal, and
reading the read pointer from the first storage location in the second storage circuit based on the first read address signal.

15. The method of claim 14 further comprising:
generating the write pointer indicating the write address in response to the write clock signal using a write pointer generator circuit;
generating the read pointer indicating the read address in response to the read clock signal using a read pointer generator circuit;
generating a first comparison signal using a first comparator circuit based on a comparison between the write pointer synchronized with the write clock signal and the read pointer synchronized with the write clock signal; and
generating a second comparison signal using a second comparator circuit based on a comparison between the read pointer synchronized with the read clock signal and the write pointer synchronized with the read clock signal.

16. The method of claim 14, wherein synchronizing the write pointer with the read clock signal using a second first-in first-out circuit further comprises:
generating a second read address signal and a second write address signal using a second loop circuit;
storing the write pointer at a second storage location in a third storage circuit indicated by the second write address signal; and
reading the write pointer from the second storage location in the third storage circuit based on the second read address signal.

17. The method of claim 16, wherein generating a second read address signal and a second write address signal using a second loop circuit further comprises generating the second write address signal based on the second read address signal using first metastability harden register circuits and an inverter circuit, and generating the second read address signal based on the second write address signal using second metastability harden register circuits.

18. The method of claim 14, wherein generating a first read address signal and a first write address signal using a first loop circuit further comprises generating the first write address signal based on the first read address signal using first metastability harden register circuits and an inverter circuit, and generating the first read address signal based on the first write address signal using second metastability harden register circuits.

19. A first first-in first-out circuit comprising:
- a first storage circuit to store write data at a write address in response to a write clock signal in a write clock domain, the first storage circuit to provide read data from a read address in response to a read clock signal in a read clock domain, wherein a write pointer indicating the write address is synchronized with the write clock signal, and wherein a read pointer indicating the read address is synchronized with the read clock signal; and
- a second first-in first-out circuit to transfer the read pointer from the read clock domain to the write clock domain, wherein the second first-in first-out circuit comprises:
  - a first loop circuit to generate a first read address signal and a first write address signal, and
  - a second storage circuit to store the read pointer at a first storage location indicated by the first write address signal and to read the read pointer from the first storage location based on the first read address signal.

20. The first first-in first-out circuit of claim 19 further comprising:
- a third first-in first-out circuit to transfer the write pointer from the write clock domain to the read clock domain.

21. The first first-in first-out circuit of claim 20, wherein the third first-in first-out circuit comprises:
- a second loop circuit to generate a second read address signal and a second write address signal; and
- a third storage circuit to store the write pointer at a second storage location indicated by the second write address signal and to read the write pointer from the second storage location based on the second read address signal.

22. The first first-in first-out circuit of claim 20 further comprising:
- a first comparator circuit to generate a first comparison signal based on a comparison between the write pointer synchronized with the write clock signal and the read pointer synchronized with the write clock signal; and
- a second comparator circuit to generate a second comparison signal based on a comparison between the read pointer synchronized with the read clock signal and the write pointer synchronized with the read clock signal.

\* \* \* \* \*